United States Patent
Narasimalu et al.

(10) Patent No.: US 7,572,675 B2
(45) Date of Patent: Aug. 11, 2009

(54) MOLD FLASH REMOVAL PROCESS FOR ELECTRONIC DEVICES

(75) Inventors: Srikanth Narasimalu, Singapore (SG); Premkumar Jeromerajan, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 555 days.

(21) Appl. No.: 11/338,206

(22) Filed: Jan. 24, 2006

(65) Prior Publication Data

US 2007/0170602 A1 Jul. 26, 2007

(51) Int. Cl.
*H01L 21/00* (2006.01)
(52) U.S. Cl. .................................. 438/115
(58) Field of Classification Search .............. 438/15, 438/115
See application file for complete search history.

(56) References Cited

U.S. PATENT DOCUMENTS

| | | | | |
|---|---|---|---|---|
| 4,544,446 A * | 10/1985 | Cady | .......................... | 438/689 |
| 6,230,719 B1 | 5/2001 | Wensel | ........................ | 134/1.1 |
| 6,602,430 B1 * | 8/2003 | Nally et al. | ................... | 216/13 |
| 6,800,932 B2 * | 10/2004 | Lam et al. | ..................... | 257/706 |
| 6,838,637 B2 | 1/2005 | Song et al. | ............. | 219/121.72 |
| 7,226,269 B2 * | 6/2007 | Sundar et al. | ............ | 414/744.5 |
| 7,279,343 B1 * | 10/2007 | Weaver et al. | .................. | 438/4 |
| 2002/0048825 A1 * | 4/2002 | Young et al. | ..................... | 438/4 |
| 2002/0187595 A1 * | 12/2002 | Walitzki et al. | ............. | 438/184 |
| 2004/0018651 A1 * | 1/2004 | Nadeau | ........................ | 438/15 |
| 2004/0140856 A1 * | 7/2004 | Bang et al. | ..................... | 331/68 |
| 2005/0255795 A1 * | 11/2005 | Said | ............................. | 451/40 |
| 2006/0076671 A1 * | 4/2006 | Kariya et al. | ................ | 257/702 |
| 2007/0080437 A1 * | 4/2007 | Marimuthu et al. | ......... | 257/676 |
| 2007/0178628 A1 * | 8/2007 | Lim | ........................... | 438/113 |

FOREIGN PATENT DOCUMENTS

JP 2004-006693 1/2004

* cited by examiner

*Primary Examiner*—N Drew Richards
*Assistant Examiner*—Ankush K Singal
(74) *Attorney, Agent, or Firm*—Ostrolenk, Faber, Gerb & Soffen, LLP

(57) ABSTRACT

A method is provided for removing excess encapsulation material from unmolded surfaces of a molded substrate including semiconductor packages by utilizing an acid solution. The method comprises the steps of mounting the substrate to a holding device with the unmolded surfaces facing an acid source for supplying an acid solution, contacting the unmolded surfaces with the acid solution for a sufficient time to remove the excess encapsulation material from the unmolded surfaces while substantially avoiding contact with molded surfaces thereof, and thereafter removing the substrate from contact with the acid solution.

20 Claims, 6 Drawing Sheets

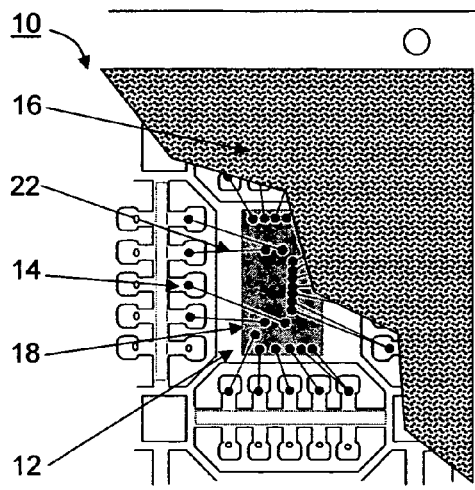 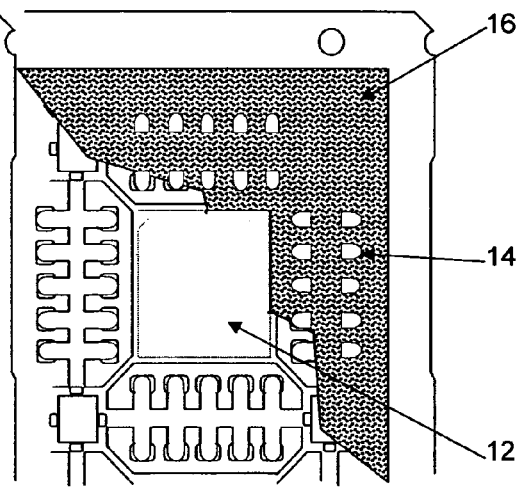
FIG. 1A (Prior Art)   FIG. 1B (Prior Art)
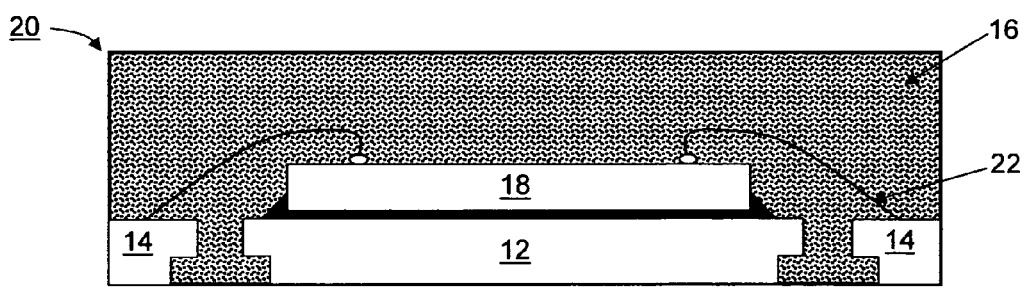
FIG. 2 (Prior Art)

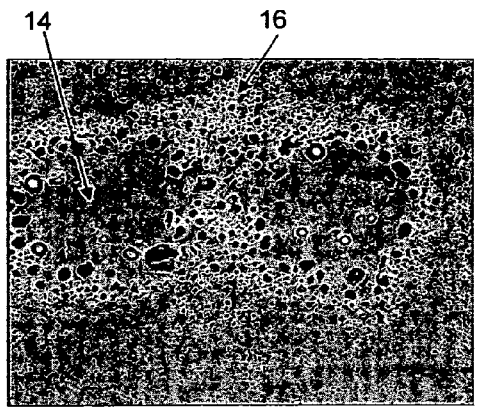 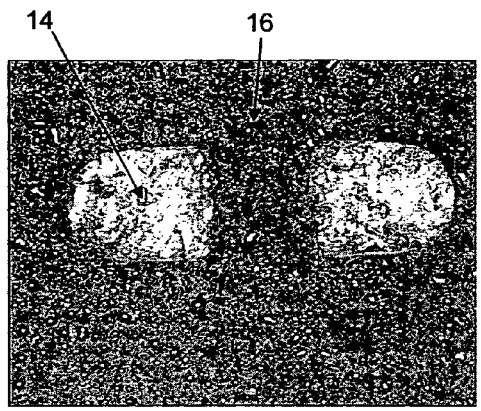
FIG. 7A  FIG. 7B
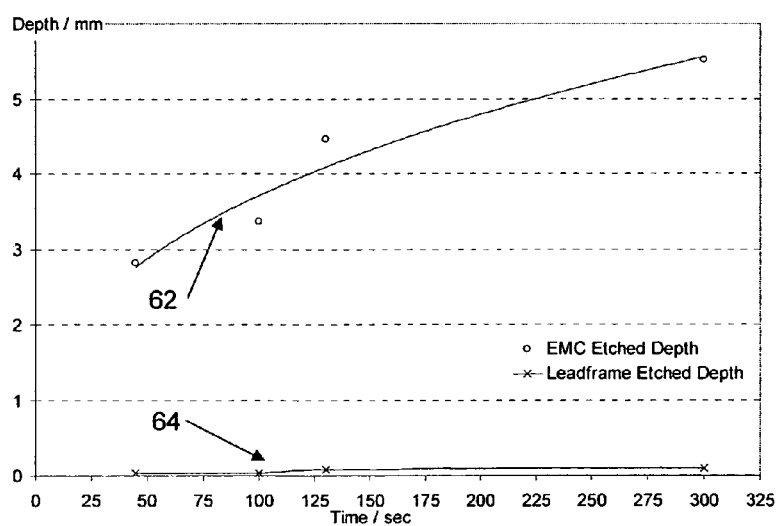
FIG. 8

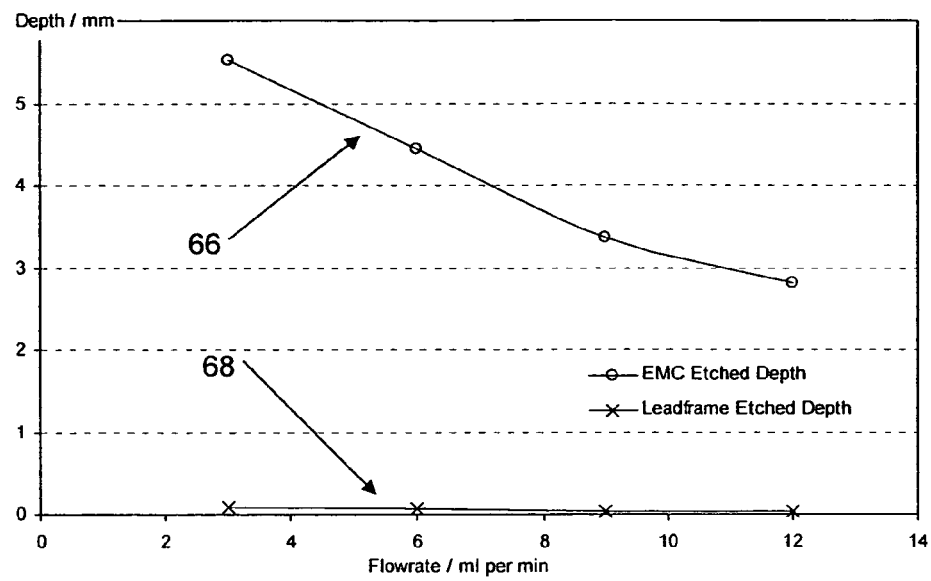
FIG. 9
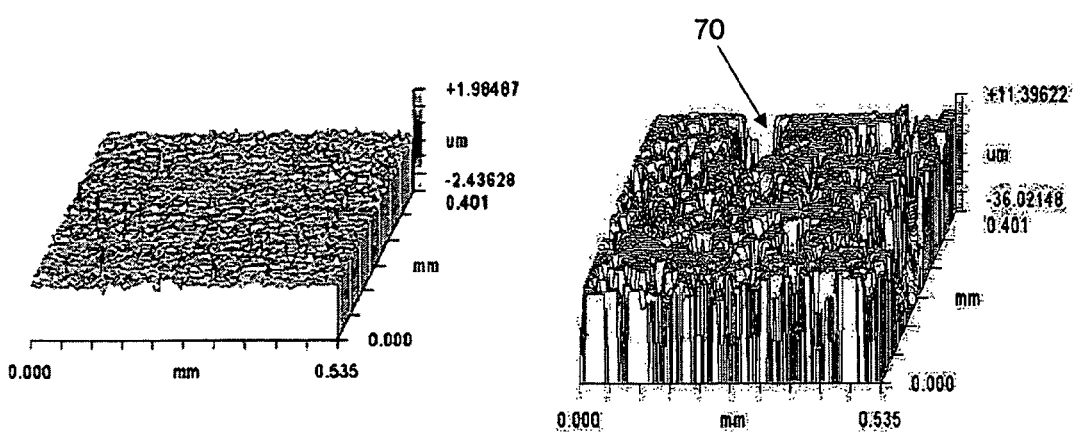
FIG. 10A  FIG. 10B

MOLD FLASH REMOVAL PROCESS FOR ELECTRONIC DEVICES

FIELD OF THE INVENTION

The invention relates to the processing of semiconductor devices, and in particular to the removal of mold flash from molded substrates including semiconductor packages.

BACKGROUND AND PRIOR ART

In the assembly of semiconductor packages, molding is one of the key manufacturing processes in which semiconductor components bonded to a substrate are encapsulated with plastic or resin material, such as epoxy molding compound (EMC), to protect them from the environment. In one example, the substrates are leadframes that have semiconductor dice comprising integrated circuits attached to them. Thereafter, the integrated circuits are electrically connected to leads on the leadframes by bonding wires. The EMC will generally encapsulate the bonding wires, part of the leads and the dice.

In some semiconductor packages like molded leadless packages or Quad-Flat No-Lead (QFN) packages, the leads are exposed at the bottom of the devices for electrically connecting the packages to external devices. FIGS. 1A and 1B are an elevation view and a back view respectively of a leadframe 10 of the prior art that has been partially molded with EMC 16. The EMC 16 should not cover certain portions of the leads 14 that need to be connected to external devices. Also, it may be preferable not to cover a die-attach pad 12 on which a semiconductor die 18 has been attached to improve heat dissipation of the package.

Referring to FIG. 1A, the leadframe 10 comprises a plurality of leads 14 surrounding a centrally located die-attach pad 12. After a semiconductor die 18 has been adhesively attached to the die-attach pad 12 and electrically connected to the leads 14 by bonding wires 22, the wire-bonded leadframe 10 is then encapsulated with EMC 16, which is shown partially molded onto the leadframe 10. Referring to FIG. 1B, the partially molded leadframe 10 is shown with the leads 14 and the die-attach pad 12 exposed on the bottom surface. The EMC 16 should not conceal the leads 14 as this will affect the wettability of solder during a solder attachment process, and result in its inability to form electrical connections to external devices.

FIG. 2 is a sectional side view of a molded leadless package 20 of the prior art. For packaging of leadless semiconductor devices, EMC 16 is molded on only one side of the leadframe substrate. The opposite side of the substrate is substantially free of EMC 16. However, if the non-molded surface of the substrate is not properly sealed, the EMC 16 may seep into the non-molded side of the substrate and the excess encapsulating material may solidify to form mold flash or bleed.

One of the methods to minimize the formation of mold flash caused by leakage of molding compound onto the non-molded surfaces is through masking the bottom surface of the leadframe 10 with an adhesive tape prior to molding. In Japanese publication patent number JP2004006693 entitled "Adhesive Sheet for Manufacturing Semiconductor Device", a tape approach is illustrated in which a polyamide tape is adhesively attached to the bottom surface of the leadframe 10 prior to a molding process.

One of the problems with using such an adhesive tape is that it incurs additional manufacturing cost and requires additional processes, such as for attaching and detaching the tape from the leadframes 10. Moreover, the tape is not environmentally friendly, and it is not re-usable.

These additional processes often result in contamination, such as remnants of adhesive remaining on the leadframe 10, and hence cause problems such as poor solderability during later processing during package assembly. Furthermore, the additional layer of soft polyamide tape attached under the leadframes 10 will introduce compliance to the leads 14 during the wire bonding process. Thus, it may result in poor wire-bonding quality. Therefore, it would be desirable to avoid the use of adhesive tape for the manufacturing of leadless packages.

If an adhesive tape is not used and sealing of the non-molded surface cannot be achieved, it is usually necessary to remove the excess encapsulation material after the molding process. There are various apparatus and methods that have been implemented in the prior art to remove the excess encapsulation material after molding.

In a laser ablation approach illustrated in U.S. Pat. No. 6,838,637 entitled "Method and Apparatus for Deflashing of Integrated Circuit Packages", the apparatus includes two lasers for performing deflashing. A CO2 laser is used to remove a top layer of flash and a YAG laser is then used to remove a thin layer of flash remaining after the CO2 laser deflashing. The CO2 laser deflashing followed by the YAG laser deflashing seek to remove the flash and avoid damaging the semiconductor packages.

However, the laser ablation approach is costly and time consuming. It utilizes a point attack method to remove the mold flash. Thus, the processing time for deflashing a molded leadframe 10 comprising a large number of units of leadless packages 20, would be unduly long.

In a plasma etching approach illustrated in U.S. Pat. No. 6,230,719 entitled "Apparatus for Removing Contaminants on Electronic Device", plasma gas is supplied to a reaction chamber and the encapsulated packages are exposed to the plasma gas, thereby removing the excess molding material and other contaminants from the surfaces of the packages.

The problem with using the aforesaid plasma etching approach is that the plasma gas may react with the EMC 16 to form silica residue and charred material. Hence, after the plasma etching process, the molded leadframes 10 need to undergo another cleaning process for washing and removing the residue and charred material. Therefore, the additional cleaning process may render this approach less efficient and cost effective.

It would be advantages to avoid some of the aforesaid disadvantages of the prior art by providing a simple and cost effective apparatus for removing excess encapsulating material from an unmolded surface of a molded leadframe.

SUMMARY OF THE INVENTION

It is thus an object of the invention to seek to provide a mold flash removal apparatus for cleaning a molded leadless leadframe whereby excess encapsulation material on an unmolded surface of molded substrate is removable.

Accordingly, the invention provides a method for removing excess encapsulation material from unmolded surfaces of a molded substrate including semiconductor packages, comprising the steps of: mounting the substrate to a holding device with the unmolded surfaces facing an acid source for supplying an acid solution; contacting the unmolded surfaces with the acid solution for a sufficient time to remove the excess encapsulation material from the unmolded surfaces while substantially avoiding contact with molded surfaces thereof; and thereafter removing the substrate from contact with the acid solution.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

Examples of apparatus and methods for removing mold flash from a molded leadframe in accordance with the invention will now be described with reference to the accompanying drawings, in which:

FIGS. 1A and 1B are an elevation view and a back view respectively of a leadframe of the prior art that has been partially molded with EMC;

FIG. 2 is a sectional side view of a molded leadless package of the prior art;

FIGS. 7A and 7B are pictures showing a surface of a molded package before and after mold flash removal respectively;

FIG. 8 is a graph showing respective depths of EMC and leadframe being etched by an acid solution with increasing exposure time;

FIG. 9 is a graph showing respective depths of EMC and leadframe being etched by the acid solution with different flow rates of the solution for approximately five minutes at a constant volume;

FIGS. 10A and 10B are graphs showing surface roughness profiles of the leadframe before and after the mold flash removal respectively;

DETAILED DESCRIPTION OF THE PREFERRED EMBODIMENTS OF THE INVENTION

Figure 3:
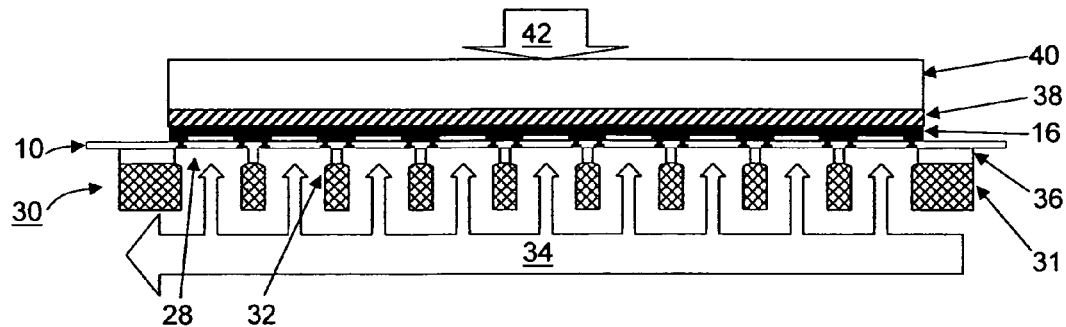
FIG. 3 is a sectional side view of a molded leadframe positioned onto a mold flash removal apparatus according to the first preferred embodiment of the invention.
Figure 4:
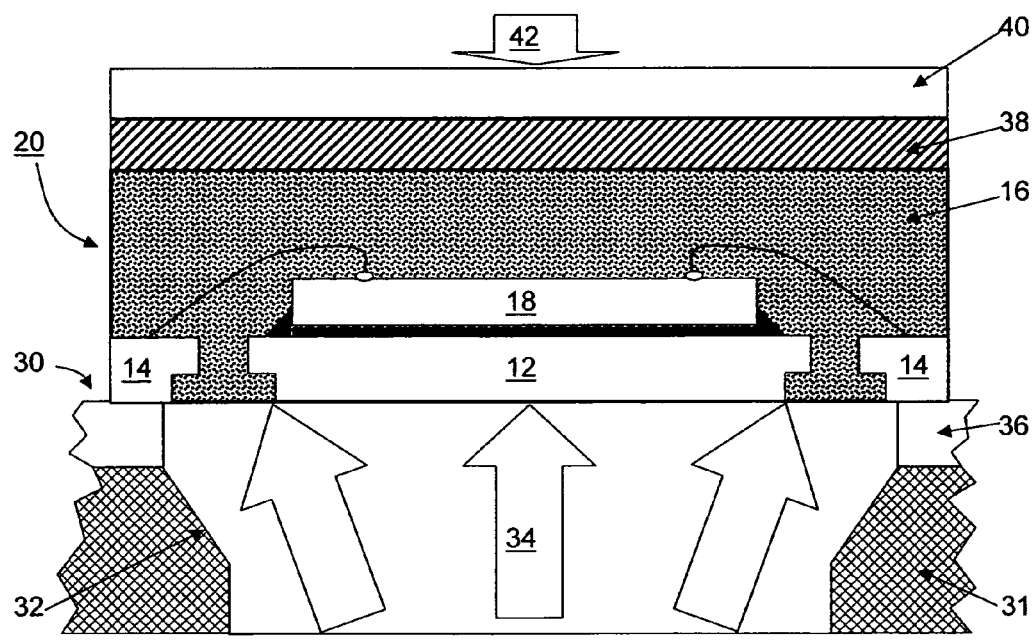
FIG. 4 is a sectional side view of a molded package comprised in the molded leadframe positioned onto the mold flash removal apparatus shown in FIG. 3

Referring to the drawings in which like parts are referred to by like numerals, FIG. 3 is a sectional side view of a molded substrate such as a molded leadframe 10 including unsingulated semiconductor packages positioned onto a mold flash removal apparatus 30 according to the first preferred embodiment of the invention. The molded leadframe 10 has a plurality of unmolded surfaces on an unmolded side corresponding to the positions of the packages. FIG. 4 is a sectional side view of a molded package 20 comprised in the molded leadframe 10 positioned onto the mold flash removal apparatus 30 shown in FIG. 3.

The mold flash removal apparatus 30 comprises a holding device in the form of a buffer sheet 36 including a plurality of through-holes. The buffer sheet 36 is preferably made of a polymeric or a ceramic material. The molded leadframe 10 is preferably positioned onto the buffer sheet 36 with the unmolded surfaces facing an acid source for supplying an acid solution such that the locations of the unmolded surfaces correspond with the locations of the through-holes 28.

The mold flash removal apparatus 30 further comprises an acid source such as a sparger 31 having a plurality of nozzles 32 positioned adjacent to the unmolded surfaces of the leadframe 10 for supplying an acid solution thereto. Therefore, each nozzle 32 corresponds to an opening of the through-holes 28 on the buffer sheet 36.

The mold flash removal apparatus 30 further comprises a pressure plate such as top plate 40 for securing the leadframe 10 against the buffer sheet 36 during the mold flash removal process. The leadframe 10 is further secured by a mechanical force 42 applied by the top plate 40 onto the leadframe 10. A layer of rubber 38 is attached between the top plate 40 and the leadframe 10 for protecting the leadframe against possible damage caused by the top plate 40. Acid solution 34 is then projected through the nozzles 32 of the sparger 31 past the through-holes 28 to contact the unmolded surfaces of the leadframe 10.

Upon reaction with the acid solution 34, the mold flash comprising EMC 16 will be etched away and removed while the leads 14 and die-attach pad 12 on the unmolded surfaces comprised in the leadframe 10 are relatively unaffected. The solution 34 reacts with the EMC 16 to form by-products comprising carbon and fillers comprising silica.

The nozzles 32 will continually inject the solution 34 so that the bottom surface of the molded package 20 is covered with the solution 34. The solution 34 will overflow at the sides of the sparger 31 and hence remove the residue from the bottom surface of the cleaned molded leadframe 10.

The unmolded surfaces are made to contact the acid solution for a sufficient time to remove the excess encapsulation material while substantially avoiding contact with the molded surfaces since only the unmolded surfaces are exposed to acid solution 34. Thereafter, the leadframe is removed from the buffer sheet 36 and from contact with the acid solution.

The acid solution 34 preferably comprises a mixture of acids. The acid composition preferably comprises 70-90% of concentrated nitric acid and 10-30% of concentrated sulfuric acid. The acid mixture or the molded leadframe may be maintained at a lukewarm temperature. However, a higher temperature will give a higher activation energy for the cleaning solution, resulting in a higher reaction rate. Therefore, it is more preferable to heat the acid solution or the molded leadframe, and the temperature of the acid solution or molded leadframe is ideally maintained at between 60° C. and 90° C.

Figure 5:
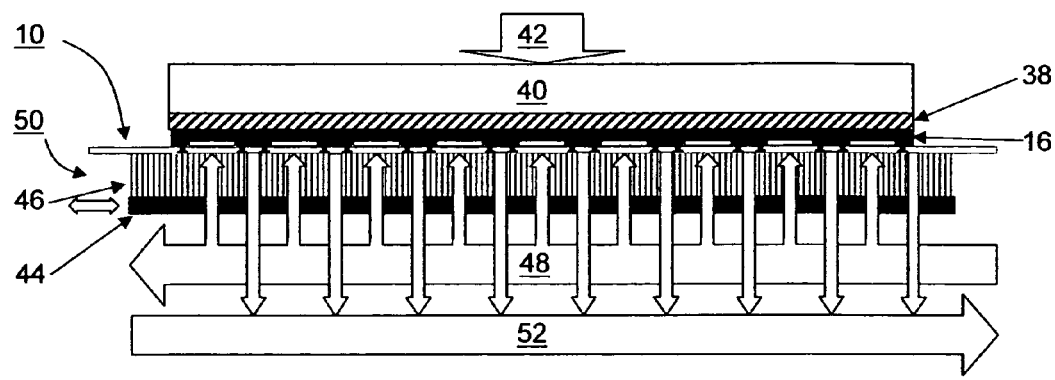
FIG. 5 is a sectional side view of a molded leadframe positioned onto a mold flash removal apparatus according to the second preferred embodiment of the invention.

In a second preferred embodiment of the invention, an acid-soaked scrubbing device may cooperate with the acid solution 34 for more efficiently removing mold flash from the molded leadframe 10. FIG. 5 is a sectional side view of a molded leadframe 10 positioned onto a mold flash removal apparatus 50 according to the second preferred embodiment of the invention.

The mold flash removal apparatus 50 comprises a scrubbing device and the unmolded surfaces of the molded leadframe 10 are positioned onto the scrubbing device for applying frictional force to the unmolded surfaces. The scrubbing device may be in the form of a brush 44 with bristles 46 for contacting the unmolded surfaces. Alternatively, the scrubbing device may be in the form of a sponge. The bristles 46 of the brush 44 or the sponge are preferably made of a polymeric material, such as Teflon, or a ceramic material.

In operation, the brush 44 is held such that the bristles 46 contact the unmolded side of the molded leadframe 10. A mechanical force 42 is applied onto the leadframe 10 via a pressure plate such as top plate 40 to which a layer of rubber 38 has been attached for securing the leadframe 10 in position. An inlet flow 48 comprising acid solution 34 is injected through the brush 44 onto the unmolded surfaces of the molded leadframe 10.

Simultaneously, the brush 44 will oscillate parallel to the bottom surface of the leadframe 10. An outlet return flow 52 for the acid solution 34 may be provided for transporting the residue away from the cleaned surface of the leadframe 10. The cleaning solution 34 cooperates with the bristles 46 of the brush 44 to enhance the removal of the mold flash from the molded leadframe 10.

Figure 6:
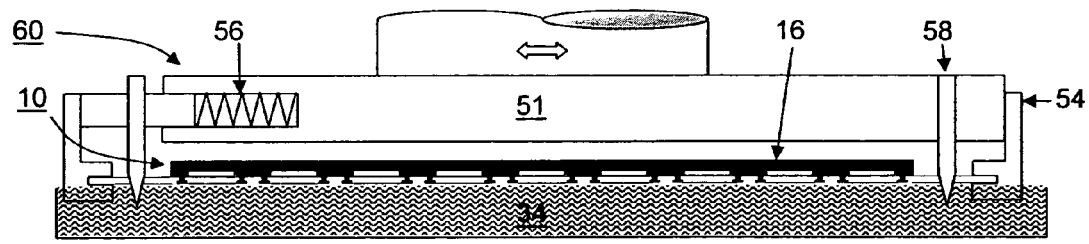
FIG. 6 is a sectional side view of a molded leadframe positioned onto a mold flash removal apparatus according to the third preferred embodiment of the invention.

In a third preferred embodiment of the invention, an oscillating member may oscillate the leadframe 10 relative to the acid solution. FIG. 6 is a sectional side view of a molded leadframe 10 positioned onto a mold flash removal apparatus 60 according to the third preferred embodiment of the invention.

The mold flash removal apparatus 60 comprises a holding device in the form of a gripper 54 having a pair of jaws for gripping the leadframe 10. The molded leadframe 10 is lowered onto a top surface of the acid solution 34 in the form of an acid bath. The leadframe 10 is aligned by inserting a pair of locating pins 58 in holes formed in the leadframe 10. A spring-loaded mechanism 56 is preferably attached to at least one of the jaws of the gripper 54 to bias it away from the leadframe and to stretch the leadframe 10 horizontally. This helps to prevent it from sagging. The spring-loaded mechanism 56, the gripper 54 and the locating pins 58 may be operatively connected to an oscillatory holder 51.

In operation, the leadframe 10 held by the gripper 54 will be aligned by the locating pins 58. The leadframe 10 is then held over the acid solution 34 with the unmolded surfaces contacting the acid cleaning solution and avoiding contact with the molded surfaces on the molded side of the leadframe. Since the solution 34 has a flat top surface, the depth of contact of the leadframe 10 can be controlled by controlled dipping of the leadframe 10 parallel to the surface of the solution 34.

When the holder is oscillated in directions parallel to the surface of the solution 34, the leadframe 10 will move correspondingly. Thus, the solution 34 is made to contact the unmolded surfaces of the leadframe 10 relatively evenly during oscillation of the leadframe 10.

Alternatively, the holder may be rotated instead of oscillated relative to the acid solution 34. By applying movement to the holder and thus to the leadframe 10, the excess encapsulation material may be automatically removed from the unmolded surfaces of the molded leadframe 10 when they are in contact with the solution 34.

FIGS. 7A and 7B are pictures showing a surface of a molded package 20 before and after mold flash removal respectively. Referring to FIG. 7A, the leads 14 on the molded package 20 are covered with mold flash after molding. The mold flash covering the leads 14 will result in poor solderability of the leads 14 to an external device. Referring to FIG. 7B, after the package 20 has been treated with an acid solution 34, mold flash is removed from the leads 14. The cleaned, exposed leads 14 will ensure better solderability.

In the preferred embodiments of the invention, the amount of mold flash to be removed from the leadframe 10 is controllable through regulating the time the acid solution 34 is allowed to contact the leadframe 10 surfaces.

An experiment was set up where a molded leadframe 10 was held in the solution 34 for a period of time. The time elapsed and the depth of EMC 16 and leadframe 10 being etched were recorded. FIG. 8 is a graph showing respective depths of EMC 16 and leadframe 10 being etched by the acid solution 34 with increasing exposure time.

The data recorded shows that after the EMC 16 was immersed in the acid solution 34 according to the preferred embodiments of the invention with a flow rate of 3 ml/min for a period of 45 seconds, the depth etched 62 was observed to be 2.82 mm. On the other hand, after the leadframe 10, which was made of copper or a copper alloy, was immersed in the acid solution 34 with a flow rate of 3 ml/min for 45 seconds, the depth etched 64 was observed to be only 0.03 mm. In practice, the mold flash usually has a depth of less than 1 mm, therefore the acid solution 34 is able to clean the leadframe 10 within a few seconds.

Moreover, the thickness of the leadframe 10 remains relatively unchanged. Hence, the acid solution 34 may effectively remove the mold flash while the leadframe material is relatively unaffected.

Accordingly, the amount of mold flash to be removed from the leadframe 10 is also controllable through controlling the flow rate of the acid solution 34. FIG. 9 is a graph showing respective depths of EMC 16 and leadframe 10 being etched by the acid solution 34 with different flow rates of the solution 34 for approximately five minutes at a constant volume.

The data recorded shows that the depth etched 66 from the EMC 16 was 5.52 mm at a solution flow rate of 3 ml/min. However, the depth etched 68 from the leadframe 10 was only 0.081 mm at the same flow rate.

As the flow rate of the solution 34 increases, the time of acid solution 34 being exposed to the leadframe decreases. This resulted in reduction in depth etched from the leadframe. Therefore, a lower flow rate is preferred for mold flash removal.

To examine the effect of the cleaning solution 34 on the surface roughness of the leadframe 10, a molded package 20 immersed in the acid solution 34 was studied and compared with a molded package 20 that had not been treated with the solution 34. FIGS. 10A and 10B are graphs showing surface roughness profiles of the leadframe 10 before and after the mold flash removal respectively.

The data showed that the leadframe 10 had a roughness of Ra 0.077 μm before the surface was cleaned of the mold flash. After the surface was treated with the cleaning solution 34, the mold flash was cleared from the surface of the leadframe 10, and the surface roughness was found to be Ra 4.475 μm. Therefore, after mold flash removal, an undulating rough profile 70 is formed on the surface of the leadframe 10 after reaction with the acid solution 34.

Figure 11A:
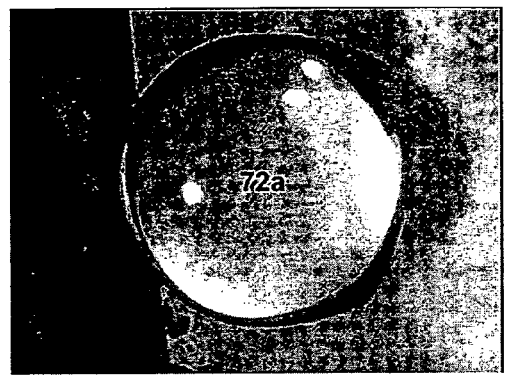
FIGS. 11A and 11B are pictures showing a water droplet on the surface of a lead before and after mold flash removal respectively using the preferred apparatus according to the invention herein.
Figure 11B:
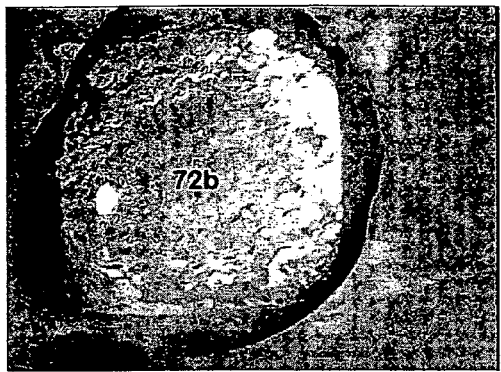

FIGS. 11A and 11B are pictures showing a water droplet on the surface of a lead 14 before and after mold flash removal respectively using the preferred apparatus according to the invention herein. The water droplet 72b appeared to smear on the surface of the lead 14 after the leadframe 10 was immersed in the cleaning solution 34 and dried. However, the water droplet 72a did not smear on the surface of the lead 14 before immersion in the solution 34. The spreading of water droplet is measured in terms of contact angle with respect to the plane of the surface. The contact angle of the water droplet 72a and 72b are measured to be 60° and 45° respectively. Thus the surface energy has increased for the leadframe 10 which was treated with the cleaning solution. Hence, after the leadframe 10 is treated with the acid solution 34, the surface roughness and surface energy of the leads 14 have improved. This indicates improved wettability and adhesion strength of the solder on the metal leads 14, which is preferred.

In an experiment to examine moisture diffusion through surface of the EMC 16 into the molded package 20, the moisture absorption property was studied for molded package 20 before and after it is treated with the cleaning solution 34 respectively. The molded package 20 was dried at 120° C. in a chamber comprising 85% relative humidity for 3 hours, and thereafter kept at room temperature.

Figure 12:
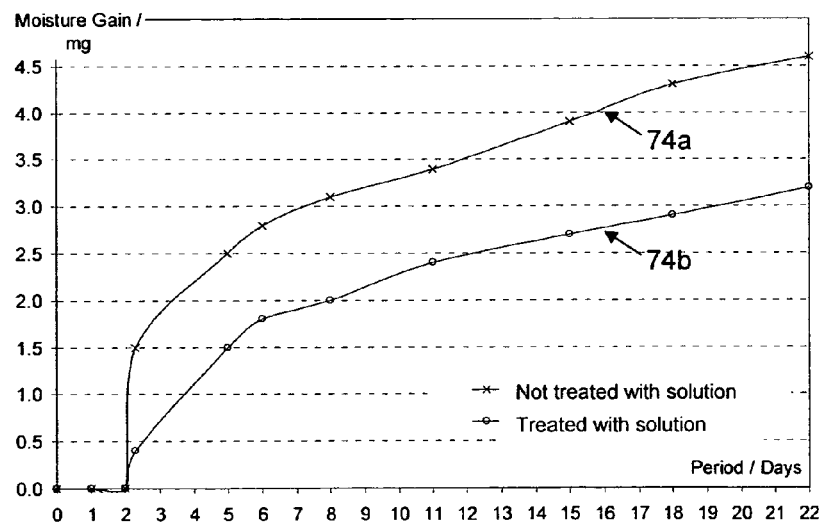
FIG. 12 is a graph showing moisture gain by a molded package when exposed to high humidity before and after the mold flash removal respectively.

FIG. 12 is a graph showing moisture gain by the molded package 20 when exposed to high humidity before and after the mold flash removal respectively. The data showed that moisture gain 74a by the molded package 20 which had not been treated with the acid solution 34 was 4.6 mg after 22 days. However, the moisture gain 74b by the acid treated molded package 20 was 3.2 mg after 22 days. Therefore, it appears that the molded package 20, which had been treated with acid solution 34, will absorb less moisture than the package 20, which was not treated with the solution 34. Less moisture absorption is preferred as moisture may lead to defects in the electronic components in the package 20.

It should be appreciated that the mold flash removal apparatus according to the preferred embodiments of the invention helps to avoid the need to utilize an adhesive tape for masking the bottom surface of the leadless package 20 prior to the molding process. Thus, the apparatus of the preferred embodiments of the invention are cost effective.

Moreover, since the acid solution 34 primarily removes the mold flash and it has limited reaction with the leadframe 10, it does not significantly affect the thickness of the leadframe 10. Therefore, it will not affect the functionality of the package. In addition, when the acid solution 34 reacts with the surface of the leads 14, a rough surface profile and increased surface energy is obtained. These improve the wettability and solderability of the molded package 20 for attachment to other devices.

The cleaning operation is also quite fast and it only takes a few seconds to clean a molded leadframe 10. The silica residue and charred material removed from the leadframe 10 may be separated from the solution 34 through filtration. The filtered acid solution 34 may be recycled by pumping back towards the leadframe. The filtered solution 34 may be mixed with fresh acid solution 34 during the cleaning process. Therefore, it may serve to improve productivity and cost efficiency.

In accordance with the foregoing, the preferred embodiments of the invention may apply to any packages with unmolded surface, such as exposed die type packages, and exposed heat sink packages. For each of these implementations, the apparatus should be similarly designed such that the acid solution will contact the unmolded surfaces to remove excess encapsulation material while substantially avoiding contact with the molded surfaces. After mold flash removal, the individual packages comprised in the molded leadframe 10 may be singulated so as to form separate molded semiconductor packages.

The invention described herein is susceptible to variations, modifications and/or addition other than those specifically described and it is to be understood that the invention includes all such variations, modifications and/or additions which fall within the spirit and scope of the above description.

The invention claimed is:

1. Method for removing excess encapsulation material from unmolded surfaces of a molded substrate including semiconductor packages, comprising the steps of:
    mounting the substrate to a holding device with the unmolded surfaces facing an acid source for supplying an acid solution;
    contacting the unmolded surfaces with the acid solution for a sufficient time to remove the excess encapsulation material from the unmolded surfaces while substantially avoiding contact of the acid with molded surfaces of the molded substrate; and thereafter
    removing the substrate from contact with the acid solution.

2. Method as claimed in claim 1, wherein the holding device comprises a buffer sheet including a plurality of through-holes and the step of mounting the substrate further comprises the step of positioning the substrate onto the buffer sheet such that the locations of the unmolded surfaces correspond with locations of the through-holes.

3. Method as claimed in claim 1, wherein the step of mounting the substrate to a holding device further comprises the step of positioning the unmolded surfaces of the substrate onto a scrubbing device for applying frictional force to the unmolded surfaces.

4. Method as claimed in claim 1, wherein the step of mounting the substrate to a holding device further comprises securing the substrate to the holding device with a pressure plate.

5. Method as claimed in claim 1, further comprising the step of transporting acid solution including excess encapsulation material away from the unmolded surfaces.

6. Method as claimed in claim 1, wherein the holding device comprises a pair of jaws for gripping the substrate.

7. Method as claimed in claim 1, wherein the acid solution comprises 10% to 30% of concentrated sulphuric acid and 70% to 90% of concentrated nitric acid.

8. Method as claimed in claim 1, including the step of heating the acid solution or the molded substrate.

9. A molded semiconductor package wherein excess encapsulation material has been removed according to the method as claimed in claim 1.

10. Method as claimed in claim 2, wherein the buffer sheet is made of a polymeric or a ceramic material.

11. Method as claimed in claim 2, wherein the acid solution is projected from the acid source towards the substrate to contact the unmolded surfaces through the buffer sheet.

12. Method as claimed in claim 3, wherein the scrubbing device comprises a brush with bristles for contacting the unmolded surfaces.

13. Method as claimed in claim 3, wherein the scrubbing device comprises a sponge.

14. Method as claimed in claim 3, wherein the scrubbing device is made of a polymeric or a ceramic material.

15. Method as claimed in claim 3, wherein the acid solution is projected from the acid source towards the substrate to contact the unmolded surfaces through the scrubbing device.

16. Method as claimed in claim 4, including attaching a layer of rubber material between the pressure plate and the substrate.

17. Method as claimed in claim 6, wherein at least one of the jaws is biased away from the substrate to stretch the substrate.

18. Method as claimed in claim 6, further comprising the step of oscillating the substrate in directions parallel to the acid source.

19. Method as claimed in claim 6, further comprising the step of rotating the substrate relative to the acid source.

20. Method as claimed in claim 8, wherein the acid solution or the molded substrate is heated to a temperature of between 60° C. and 90° C.

* * * * *

UNITED STATES PATENT AND TRADEMARK OFFICE
CERTIFICATE OF CORRECTION

PATENT NO.      : 7,572,675 B2                                                Page 1 of 1
APPLICATION NO. : 11/338206
DATED           : August 11, 2009
INVENTOR(S)     : Narasimalu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 657 days.

Signed and Sealed this

Seventh Day of September, 2010

David J. Kappos
*Director of the United States Patent and Trademark Office*